United States Patent
Yamamoto et al.

(10) Patent No.: US 9,018,775 B2
(45) Date of Patent: Apr. 28, 2015

(54) SEMICONDUCTOR DEVICE

(71) Applicant: Mitsubishi Electric Corporation, Tokyo (JP)

(72) Inventors: Yasukazu Yamamoto, Tokyo (JP); Katsumi Miyawaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/222,723

(22) Filed: Mar. 24, 2014

(65) Prior Publication Data

US 2015/0008596 A1    Jan. 8, 2015

(30) Foreign Application Priority Data

Jul. 8, 2013 (JP) .................................. 2013-142861

(51) Int. Cl.
H01L 23/00    (2006.01)

(52) U.S. Cl.
CPC ................ H01L 24/69 (2013.01); H01L 24/48 (2013.01)

(58) Field of Classification Search
CPC ................................. H01L 24/69; H01L 24/48
See application file for complete search history.

(56) References Cited

U.S. PATENT DOCUMENTS

| | | | | |
|---|---|---|---|---|
| 5,072,283 A | * | 12/1991 | Bolger | 257/676 |
| 6,046,495 A | * | 4/2000 | Urushima | 257/668 |
| 6,441,476 B1 | * | 8/2002 | Emoto | 257/686 |

FOREIGN PATENT DOCUMENTS

| | | |
|---|---|---|
| JP | 63-34194 A | 2/1988 |
| JP | 5-31226 U | 4/1993 |
| JP | 6-21244 U | 3/1994 |
| JP | 10-92778 A | 4/1998 |
| JP | 2001-298147 A | 10/2001 |
| JP | 2004-103919 A | 4/2004 |

* cited by examiner

Primary Examiner — Roy Potter
(74) Attorney, Agent, or Firm — Leydig, Voit & Mayer, Ltd.

(57) ABSTRACT

A semiconductor device includes: a substrate; first and second pads disposed adjacent to each other on the substrate; an electrically conductive tape adhered to the first and second pads and having a through hole at an inner portion of the first pad; an electrically conductive adhesive in the through hole and having a thermal conductivity higher than the thermal conductivity of the electrically conductive tape; a semiconductor chip mounted on the first pad via the electrically conductive adhesive; and an electronic component part mounted on the second pad via the electrically conductive tape.

2 Claims, 2 Drawing Sheets

SEMICONDUCTOR DEVICE

BACKGROUND OF THE INVENTION

1. Field of the Invention

The present invention relates to a semiconductor device which can improve the desired quality and productivity of the product.

2. Background Art

A need has arisen for close-adjacency mounting for mounting semiconductor chips and capacitor parts at a high density in a narrowly spaced state in optical modules and portable telephone power amplifiers in order to improve electrical characteristics and to achieve a size reduction effect. In an existing mounting method, an Ag paste resin is applied on die pads by transfer or dispensing, and component parts are placed on the Ag paste resin by an automatic die bonding device. A method of mounting a component part with an electrically conductive tape has also been proposed (see, for example, paragraphs 0013 and 0014 and FIG. 3 in Japanese Utility Model Laid-Open No. 6-21244).

SUMMARY OF THE INVENTION

In the case of mounting with an Ag paste resin, the Ag paste resin overflows from chip ends and parts ends. In the case of close-adjacency mounting in particular, masses of Ag paste resin overflowing from such places are superposed in a narrow space and the amount of the resin therein is increased. The Ag past resin, therefore, can climb up onto upper surfaces of a semiconductor chip and an electronic part to cause a short circuit between upper surface electrodes and wiring on the lower surface side. On the other hand, in a case where an active component part through which a large current is caused to flow and which generates a large amount of heat is mounted on an electrically conductive tape, there is a possibility of the heat release effect and the current capacity being insufficient and, hence, a possibility of malfunctioning of the component part. As a result, the reliability and the productivity of the product are reduced.

In view of the above-described problems, an object of the present invention is to provide a semiconductor device which can improve the desired quality and productivity of the product.

According to the present invention, a semiconductor device includes: a substrate; first and second pads disposed adjacent to each other on the substrate; an electrically conductive tape adhered to the first and second pads and having a through hole on an inner portion of the first pad; a conductive adhesive applied in the through hole and having heat conductivity higher than that of the conductive tape; a semiconductor chip mounted on the first pad by the conductive adhesive; and an electronic component part mounted on the second pad by the conductive tape.

The present invention makes it possible to improve the desired quality and productivity of the product.

Other and further objects, features and advantages of the invention will appear more fully from the following description.

DETAILED DESCRIPTION OF THE PREFERRED EMBODIMENTS

Figure 1:
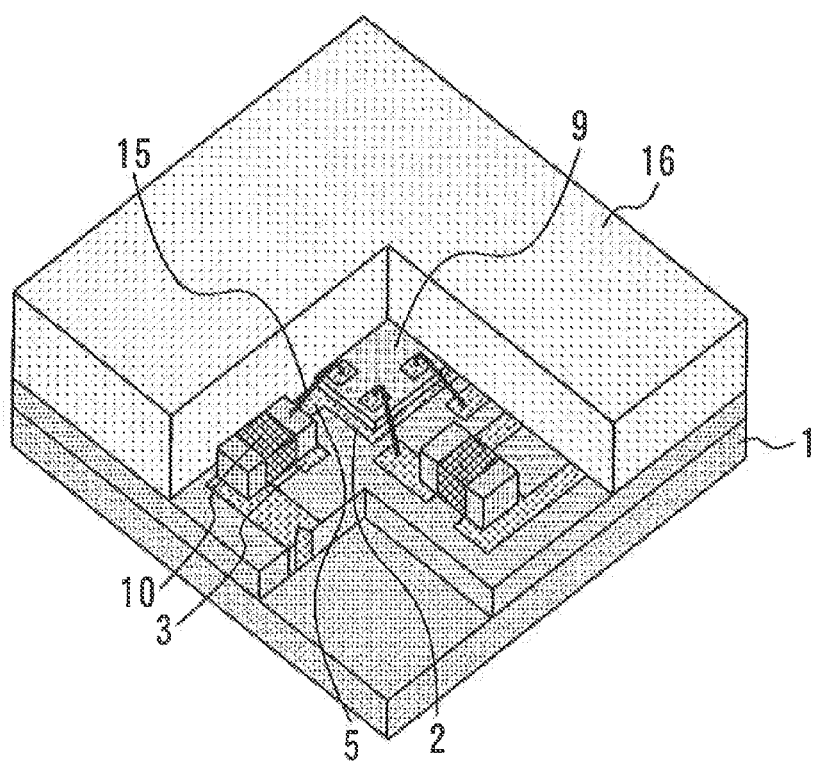
FIG. 1 is a perspective view of a semiconductor device according to an embodiment of the present invention.
Figure 2:
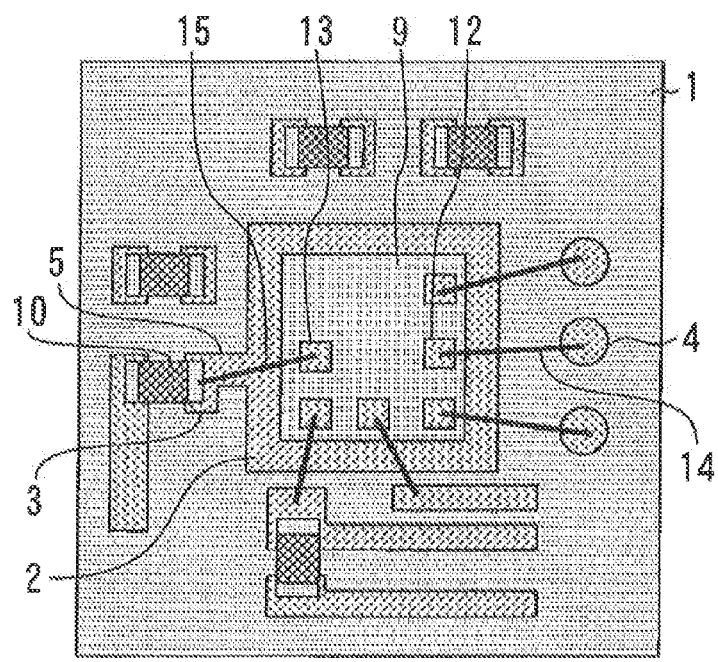
FIG. 2 is a top view of the interior of the semiconductor device according to the embodiment of the present invention.
Figure 3:
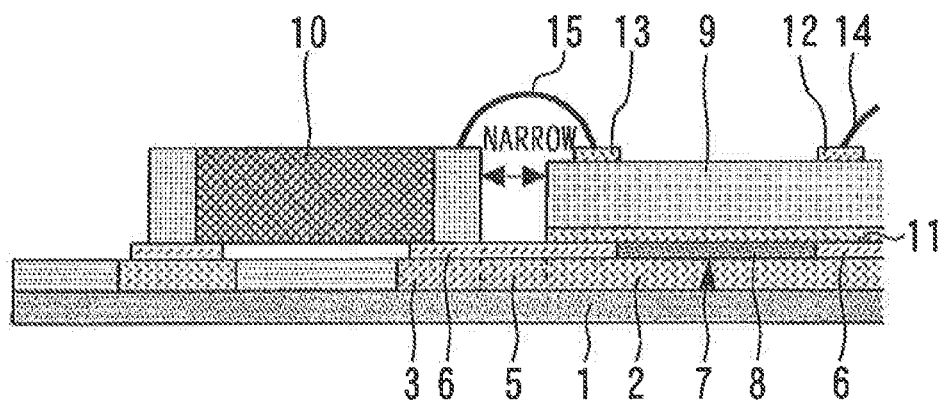
FIG. 3 is a sectional view of a main part of the semiconductor device according to the embodiment of the present invention.

FIG. 1 is a perspective view of a semiconductor device according to an embodiment of the present invention. In FIG. 1, a portion of the device is removed to show an internal portion of the device. FIG. 2 is a top view of the interior of the semiconductor device according to the embodiment of the present invention. FIG. 3 is a sectional view of a main part of the semiconductor device according to the embodiment of the present invention.

A substrate 1 is formed of a ceramic or organic material. An electric circuit having pads 2, 3, and 4 and wiring 5 is provided on an upper surface of the substrate 1. The pads 2 and 3 are disposed adjacent to each other and connected to each other through the wiring 5. For the purpose of improving solderability and wire bondability, the pads 2, 3, and 4 are surface-treated to have Au plating as outermost layers.

An electrically conductive tape 6 is adhered to the pads 2 and 3. The conductive tape 6 is, for example, a die bond film that can harden when heated and can maintain bonding strength. The conductive tape 6 has a through hole 7 on an inner portion of the pad 2. An electrically conductive adhesive 8 is applied in the through hole 7. The conductive adhesive 8 is, for example, an Ag paste resin (Ag epoxy resin, Ag polyimide resin) or solder. The conductive adhesive 8 has heat conductivity higher than that of the conductive tape 6.

A semiconductor chip 9 is mounted on the pad 2 by the conductive tape 6 and the conductive adhesive 8. An electronic component part 10 is mounted on the pad 3 by the conductive tape 6. The semiconductor chip 9 is an active component part through which a large current is caused to flow, and which generates a large amount of heat. The electronic component part 10 is, for example, a capacitor, an inductor or a switch.

A lower electrode 11 is provided on a lower surface of the semiconductor chip 9. Upper electrodes 12 and 13 are provided on an upper surface of the semiconductor chip 9. The lower electrode 11 is connected to the pad 2 through the conductive adhesive 8. The size of the through hole 7 is slightly smaller than the external size of the semiconductor chip 9. Since the conductive tape 6 has a certain thickness, the conductive adhesive 8 remains between the lower electrode 11 and the pad 2 in the through hole 7 of the conductive tape 6.

The upper electrode 12 of the semiconductor chip 9 is connected to the pad 4 through a metal wire 14, while the upper electrode 13 is connected to the electronic component part 10 through a metal wire 15. The semiconductor chip 9, the electronic component part 10 and the metal wires 14 and 15 are encapsulated with a resin 16.

Figure 4:
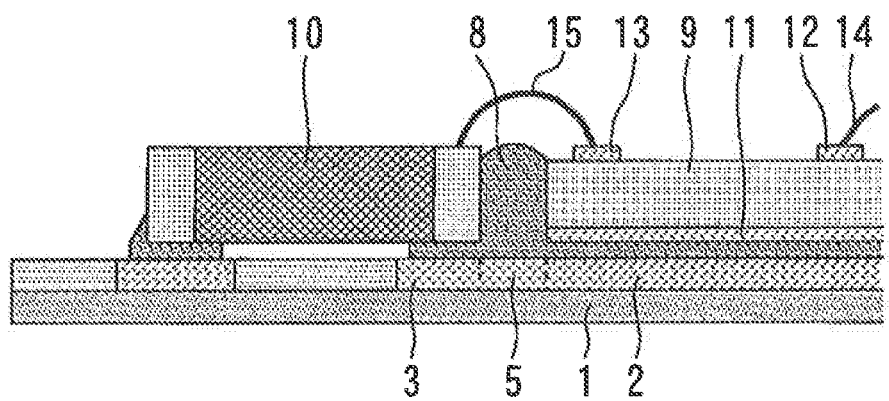
FIGS. 4 and 5 are sectional views of a semiconductor device according to the comparative example.
Figure 5:
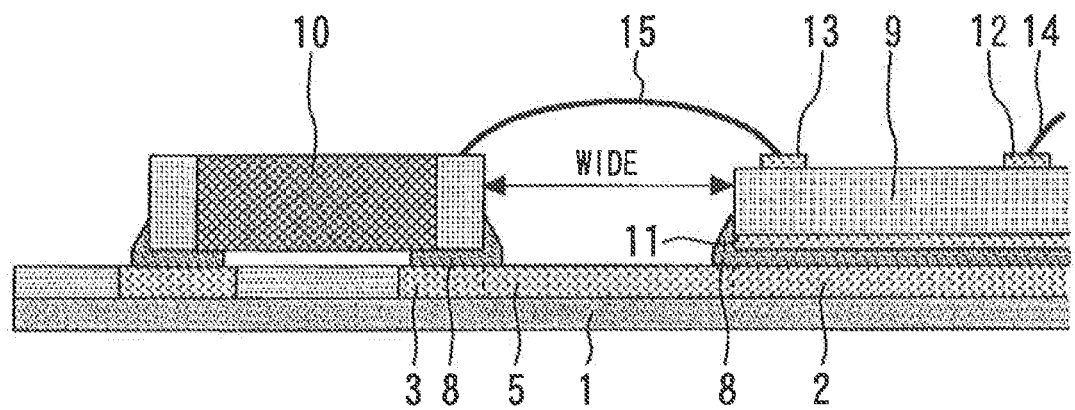

The effects of the present embodiment will subsequently be described in comparison with a comparative example. FIGS. 4 and 5 are sectional views of a semiconductor device according to the comparative example. In the comparative example, only the conductive adhesive 8 is used for mounting the semiconductor chip 9 and the electronic component part 10. Therefore, if the spacing between the semiconductor chip 9 and the electronic component part 10 is reduced as shown in FIG. 4, the conductive adhesive 8 overflowing from the component parts climbs up onto upper surfaces of the semiconductor chip 9 and the electronic component part 10 to cause a short circuit between the upper electrode 13 and the pad 2 on the lower surface side, for example. It is, therefore, necessary to increase the spacing between the semiconductor chip 9 and the electronic component part 10 as shown in FIG. 5.

In the present embodiment, the semiconductor chip 9 is mounted by using the conductive adhesive 8 applied in the through hole 7 of the conductive tape 6. Since the semiconductor chip 9 functions as a lid, the conductive adhesive 8 can be prevented from leaking and spreading from the through hole 7. Therefore, the spacing between the semiconductor chip 9 and the electronic component part 10 can be reduced. Consequently, the size of the product can be reduced and the lengths of metal wires 15 connected between the component parts can be reduced to improve electrical characteristics. Also, the conductive adhesive 8 having high heat conductivity is used for mounting the semiconductor chip 9, thereby ensuring the heat release effect and the current capacity. As a result, the desired quality and productivity of the product can be improved. There is no problem with mounting the electronic component part 10, which is not an active component part, by using the conductive tape 6.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-142861, filed on Jul. 8, 2013 including specification, claims, drawings and summary, on which the Convention priority of the present application is based, is incorporated herein by reference in its entirety.

What is claimed is:

1. A semiconductor device comprising:
    a substrate;
    first and second pads disposed adjacent to each other on the substrate;
    an electrically conductive tape adhered to the first and second pads and having a through hole at an inner portion of the first pad;
    an electrically conductive adhesive in the through hole and having a thermal conductivity higher than thermal conductivity of the electrically conductive tape;
    a semiconductor chip mounted on the first pad via the electrically conductive adhesive; and
    an electronic component part mounted on the second pad via the electrically conductive tape.

2. The semiconductor device according to claim 1, including:
    a lower electrode located on a lower surface of the semiconductor chip,
    an upper electrode located on an upper surface of the semiconductor chip, wherein the lower electrode is connected to the first pad through the electrically conductive adhesive, and
    a metal wire connecting the upper electrode to the electronic component part.

* * * * *